(12) United States Patent
Koo et al.

(10) Patent No.: US 6,570,402 B2
(45) Date of Patent: May 27, 2003

(54) IMPEDANCE CONTROL CIRCUIT (75) Inventors: Kyoung-Hoi Koo, Suwon (KR); Jin-ho Seo, Seoul (KR)

(73) Assignee: Samsung Electronics, Co., Ltd., Suwon (KR)

(*) Notice: Subject to any disclaimer, the term of this patent is extended or adjusted under 35 U.S.C. 154(b) by 0 days.

(21) Appl. No.: 10/158,512

(22) Filed: May 30, 2002

(65) Prior Publication Data

US 2003/0030579 A1 Feb. 13, 2003

(30) Foreign Application Priority Data

Aug. 10, 2001 (KR) .............................. 01-48289

(51) Int. Cl.[7] ...................... H03K 17/16; H03K 19/003
(52) U.S. Cl. .......................... 326/30; 326/12; 327/316
(58) Field of Search ..................... 326/12, 21, 30–34, 326/86; 327/315, 316, 108, 109

(56) References Cited

U.S. PATENT DOCUMENTS 5,621,335 A * 4/1997 Andresen ..................... 326/30
6,166,563 A * 12/2000 Volk et al. .................... 326/87
6,496,037 B1 * 12/2002 Bertin et al. .................. 326/82

FOREIGN PATENT DOCUMENTS

JP          62038616 A  *  2/1987  .......... H03K/19/00

* cited by examiner

*Primary Examiner*—Michael Tokar
*Assistant Examiner*—James H. Cho
(74) *Attorney, Agent, or Firm*—F. Chau & Associates, LLP

(57) ABSTRACT

An impedance control circuit designed to match the impedance between a semiconductor device and a transmission medium (PCB) by using a current source installed in the semiconductor device instead of using an external resistor is provided. Since the impedance control circuit does not use an external resistor for impedance matching, the PCB size can be reduced. In particular, a controllable current source matches the impedance more precisely compared to the external resistor.

21 Claims, 6 Drawing Sheets

IMPEDANCE CONTROL CIRCUIT

BACKGROUND OF THE INVENTION

1. Field of the Invention

The present invention relates to an impedance control circuit of a semiconductor device for matching impedance between the output driver of the semiconductor device and an external system.

2. Description of the Related Art

Typically, semiconductor devices are mounted on a Printed Circuit Board (PCB). The PCB serves as a medium for transmitting data in the semiconductor devices to an external system. If there is an impedance mismatch between the PCB and the semiconductor devices when data from the semiconductor devices is output to the PCB, the data is distorted.

Conventionally, a predetermined external resistor is generally connected to a semiconductor device to match the output impedance of an output driver with the input impedance of a transmission medium such as a PCB. In some instances, an impedance control circuit is additionally included in the semiconductor device to adjust the output impedance of the output driver.

Figure 1:
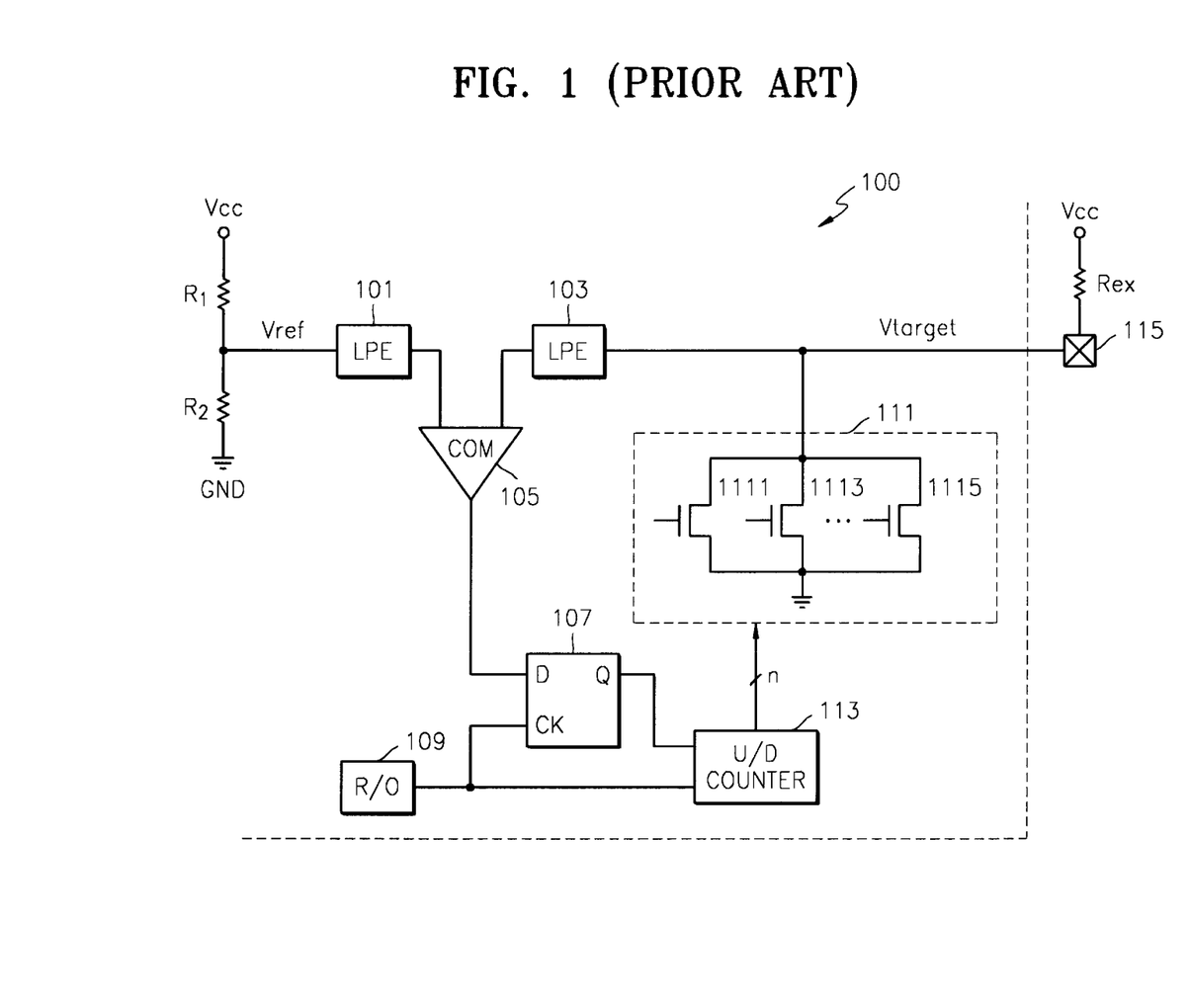
FIG. 1 is a block diagram of a conventional impedance control circuit.

FIG. 1 is a block diagram of a conventional impedance control circuit. Referring to FIG. 1, the impedance control circuit includes a first resistor R1, a second resistor R2, two low-pass filters 101 and 103, a comparator (COM) 105, a flip-flop 107, a ring oscillator (R/O) 109, an impedance adjustment circuit 111, and an up/down (U/D) counter 113. In, the impedance adjustment circuit 111, a plurality of transistors 1111 through 1115 that have gates with a different width-to-length (W/L) ratio are connected in parallel. The gates of a plurality of transistors 1111 through 1115 are opened or closed according to signals of the U/D counter 113.

The impedance control circuit is generally built in the interior (inside the dotted line) of the semiconductor device and operates in response to an external resistor (Rex) installed outside the semiconductor device (outside the dotted line) by a user.

A method for operating the conventional impedance control circuit is described below.

The first resistor R1 and the second resistor R2 are connected in series between a power supply voltage Vcc and ground voltage GND. The level of a reference voltage Vref depends on the ratio of resistance between the first resistor R1 and the second resistor R2. The external resistor Rex is connected to a pin 115 of the semiconductor device and a target voltage Vtarget is output at pin 115.

Generally, at the circuit nodes having the reference voltage Vref and the target voltage Vtarget, high frequency noise is present. The noise can be removed passing the signals at these nodes through the low-pass filters 101 and 103, respectively. The comparator 105 compares the difference, between the reference voltage Vref and the target voltage Vtarget. The compared result is saved in the flip-flop 107 which is operated in response to a signal output from the ring oscillator 109.

The U/D counter 113 receives the result saved in the flip-flop 107 and generates a plurality of control signals that control the gates of the transistors 1111 through 1115 included in the impedance adjustment circuit 111. The target voltage Vtarget is adjusted by opening or closing the transistors 1111 through 1115 in accordance with the control signals generated by the U/D counter 113.

All of the output ports of the semiconductor device that are compatible to the system's configuration and should support the target voltage Vtarget. Therefore, the control signals of the U/D counter 113 are transferred to an output driving transistor included in the output port of the semiconductor device. The transferred control signals are used to open or close the output driving transistor and match the impedance with the transmission medium, e.g., the PCB.

However, the conventional impedance control circuit illustrated in FIG. 1 has disadvantages in that an external resistor Rex must be used. It is inevitable that even the predetermined precise external resistor has at least ±5% deviation from a target resistance value. If a plurality of external resistors are used, each with a different deviation from the target resistance value, the design of the semiconductor device in the system becomes more complicated to account for such deviations. In addition, if the external resistor need be built in the PCB, the more the semiconductor ports that use the external resistor, the more external resistors are needed. As a result, the size of the PCB is increased.

SUMMARY OF THE INVENTION

To solve the above-described problems, it is an object of the present invention to provide an impedance control circuit designed to match the impedance between a semiconductor device and a transmission medium (PCB) by using a current source installed in the semiconductor device instead of using an external resistor.

To achieve the above objective, according to an embodiment of the present invention, the impedance control circuit includes a current source, an impedance adjustment circuit, a comparator, a thermal code generator, a control circuit, and a register.

The current source is installed in the semiconductor device and regularly provides a certain level of power. The impedance adjustment circuit is connected to the current source in series and adjusts the amount of current fed by the current source in accordance with a plurality of second control signals. The comparator compares a reference voltage generated by a voltage reference circuit installed in the semiconductor device with a comparison output voltage generated at a node where the current source and the impedance adjustment circuit meet. The comparator performs the above comparison according to an operation mode signal, which determines the mode of operation of a circuit, and a clock signal.

The thermal code generator is initialized by a reset signal and receives the output signal of the comparator and the clock signal. Then, the thermal code generator outputs a plurality of first control signals corresponding to the output signal of the comparator in accordance with the clock signal. The control circuit receives the output signal from the comparator and the clock signal. Then, the control circuit counts the number of logic value transitions of the output signal of the comparator and generates a complete signal depending on the clock signal if a certain pre-defined condition is met. The register latches the first control signals in response to the complete signal and generates the second control signals.

According to an aspect of the present invention, a method and an impedance control circuit are provided, comprising:
   a current source for providing a substantially constant current;
   an impedance adjustment circuit connected to the current source, for adjusting the current fed by the current source in response to a plurality of second control signals and to output an output signal at a target voltage;

a comparator for comparing a reference voltage with the target voltage and outputting a compared signal;

a thermal code generator for receiving the compared signal and a clock signal and outputting a plurality of first control signals corresponding to the compared signal in response to the clock signal;

a control circuit for receiving the compared signal and the clock signal and counting the number of logic value transitions of the compared signal and for generating a complete signal in response to the clock signal to stop operating the comparator if a predetermined condition is met; and a register for latching the first control signals in response to the complete signal and generating the second control signals.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

The configuration and operation of the invention will be described in detail with reference to the attached drawings. The same reference number in each drawing refers to the same element.

Figure 2:
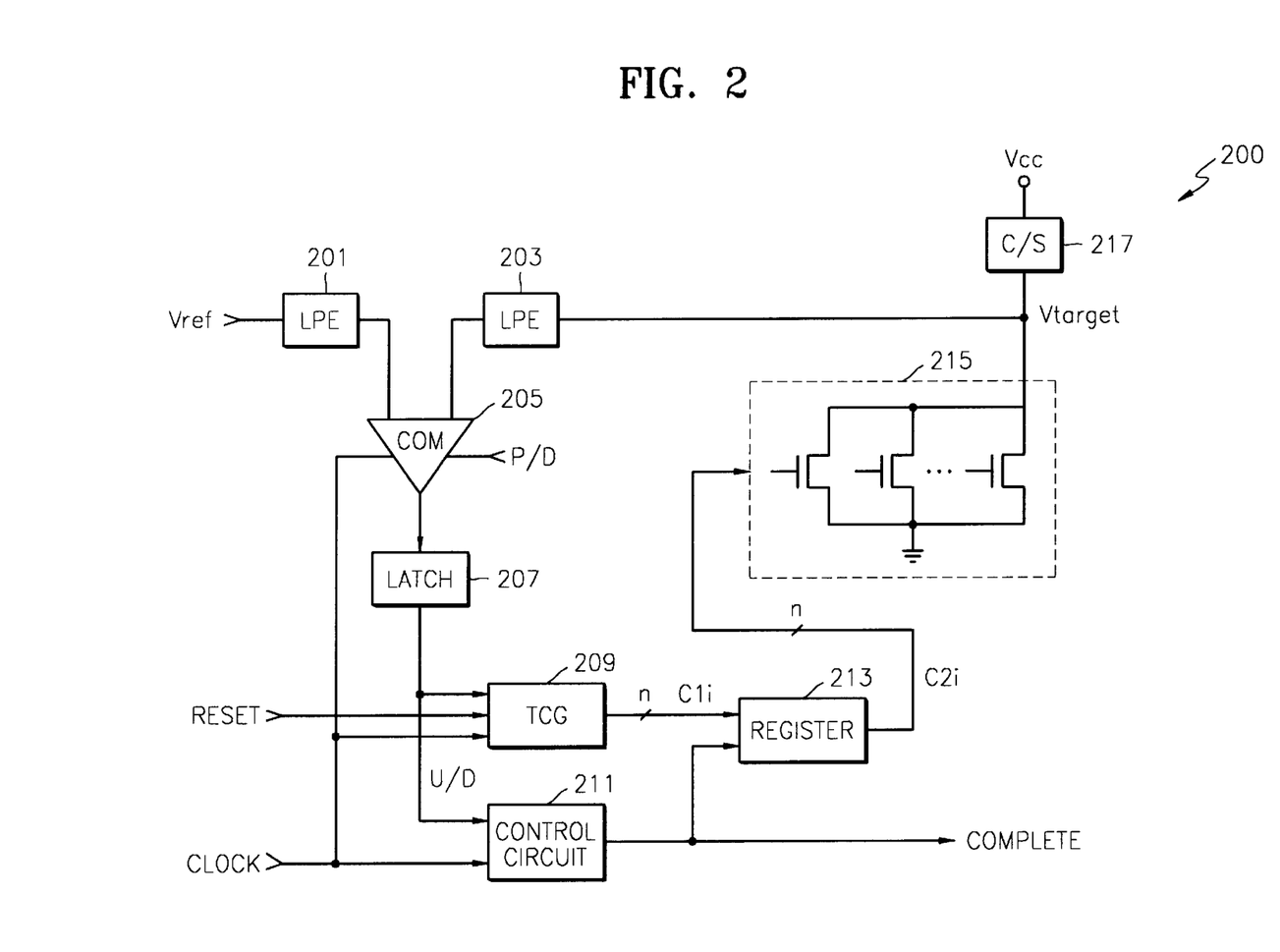
FIG. 2 is a block diagram of an impedance control circuit according to an embodiment of the present invention.

FIG. 2 is a block diagram of an impedance control circuit in a semiconductor device according to the present invention.

Referring to FIG. 2, the impedance, control circuit 200 includes a current source (C/S) 217, an impedance adjustment circuit 215, a comparator (COM) 205, a thermal code generator (TCG) 209, a control circuit 211, and a register 213.

The current source 217 is installed in the semiconductor device and regularly provides a substantially constant level of current. The impedance adjustment circuit 215 is connected to the current source 217 in series and adjusts current fed by the current source 217 in response to a plurality of second control signals C2$i$.

The comparator 205 compares a reference voltage Vref generated by a voltage reference circuit (not shown) with a comparison output voltage Vtarget generated at a node where the current source 217 and the impedance adjustment circuit 215 are connected. The comparator 205 performs the above comparison in response to an operation mode signal P/D, which determines the operation mode of a circuit, and a clock signal CLOCK.

The thermal code generator 209 is initialized by a reset signal RESET and receives an output signal U/D of the comparator 205 and the clock signal CLOCK. Then, the thermal code generator outputs a plurality of first control signals C1$i$ (where i is an integer) corresponding to the output signal U/D of the comparator 205 in response to the clock signal CLOCK. The control circuit 211 receives the output signal U/D of the comparator 205 and the clock signal CLOCK. Then, the control circuit 211 counts the number of logic value transitions of the output signal U/D of the comparator 205 and generates a complete signal COMPLETE in response to the clock signal CLOCK if a certain predetermined condition is met. The register 213 latches the first control signals C1$i$ in response to the complete signal COMPLETE and generates the plurality of second control signals C2$i$.

Since high frequency signals such as a clock signal generates noise which may also be present at the nodes having the reference voltage Vref and the comparison output voltage Vtarget, the reference voltage Vref and the comparison output voltage Vtarget are preferably fed to the input port of the comparator 205 via low-pass filters 201 and 203, respectively.

The signal output from the comparator 205 continuously changes depending on the reference voltage Vref and the comparison output voltage Vtarget. Therefore, a latch circuit 207 can be used to store a constant voltage during a predetermined period and then output the constant voltage. In particular, according to an embodiment of the present invention, when the comparator 205 is idle in response to the operation mode signal P/D, the output of the comparator 205 can be latched by the latch circuit 207 during the predetermined period and then output.

For simplicity of description, it is assumed in the present invention that the number of first control signals C1$i$ is 8, and the number of second control signals C2$i$ is 8.

Figure 3:
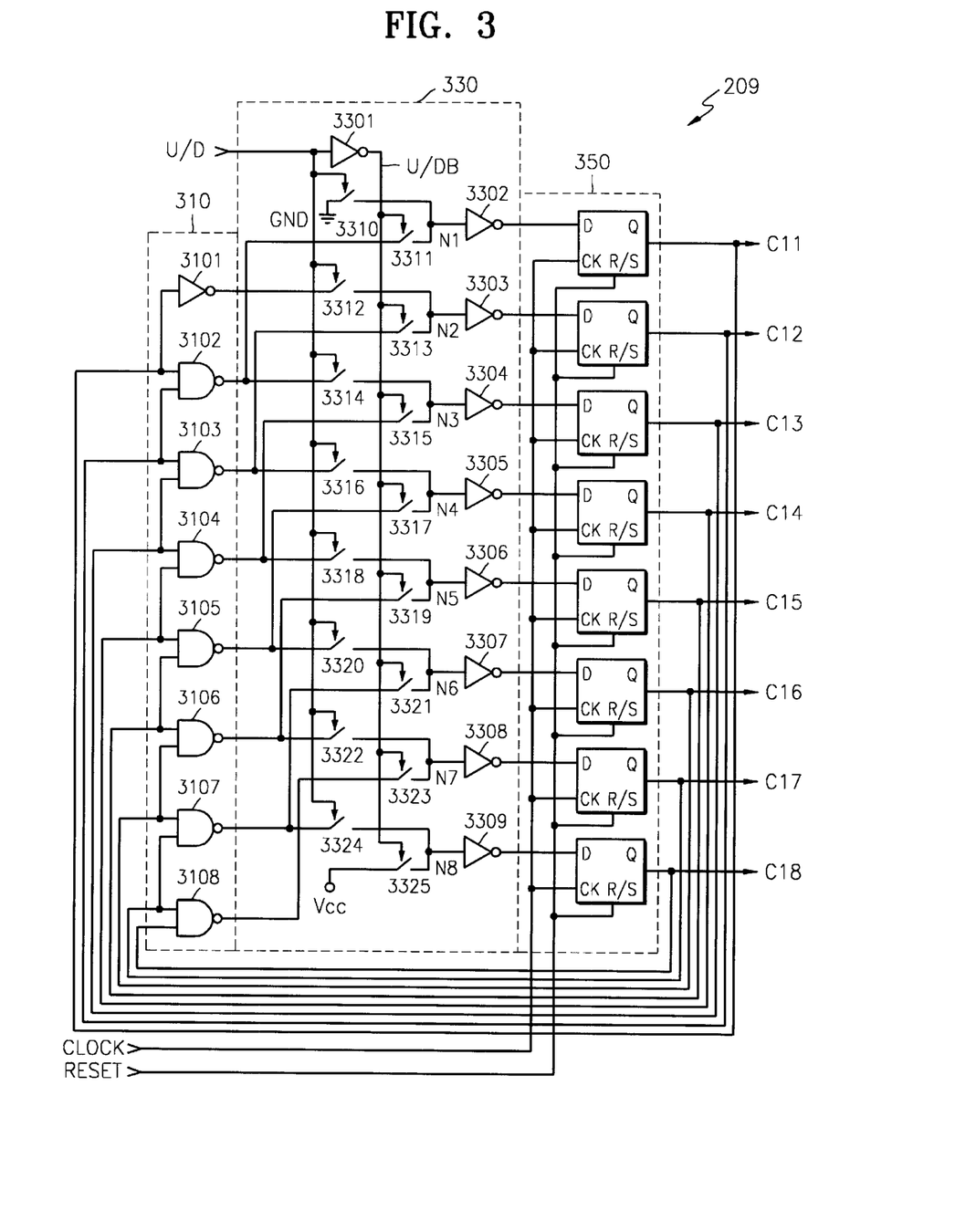
FIG. 3 is a circuit diagram of a thermal code generator in FIG. 2.

FIG. 3 is a circuit diagram of the thermal code generator 209 in FIG. 2.

Referring to FIG. 3, the thermal code generator 209 includes a logic unit 310, a switching unit 330, and a latch unit 350.

The logic unit 310 receives the plurality of first control signals C11 through C18 (hereinafter referred to as C1$i$, where i is an integer) and outputs a plurality of signals created as a result of logic operations performed on two consecutive signals of the first control signals C1$i$.

The logic unit 310 includes a first inverter 3101 and first through seventh NAND gates 3102 through 3108.

The first inverter 3101 inverts a phase of the first control signal C11. The first NAND gate 3102 responds to the first control signal C11 and the second control signal C12. The second NAND gate 3103 responds to the second control signal C12 and the third control signal C13. Similarly, the third through sixth NAND gates 3104 through 3107 respond to respective adjacent control signals. The seventh NAND gate 3108 responds to the seventh control signal C17 and the eighth control signal C18.

The switching unit 330 switches the signals output from the logic unit 310 according to the output signal U/D of the comparator 205 and sends a plurality of signals to the latch unit 350.

To perform the above functions, the switching unit 330 includes a plurality of inverters 3301 through 3309 and a plurality of switches 3310 through 3325.

The second inverter 3301 inverts the output signal U/D of the comparator 205. The third inverter 3302 inverts the signal located at a first node N1. The fourth inverter 3303 inverts the signal located at a second node N2. Likewise, the tenth inverter 3309 inverts the signal located at the eighth node N8.

The first switch 3310 supplies a ground voltage GND to the first node N1 in response to the output signal U/D of the comparator 205. The second switch 3311 supplies the output signal of the first NAND gate 3102 to the first node N1 in response to an output signal U/DB of the second inverter 3301.

The third switch 3312 supplies the output signal of the first inverter 3101 to the second node N2 in response to the output signal U/D of the comparator 205. The fourth switch 3313 supplies the output signal of the second NAND gate 3103 to the second node N2 in response to the output signal U/DB of the second inverter 3301.

The fifth switch 3314 supplies the output signal of the first NAND gate 3102 to the third node N3 in response to the output signal U/D of the comparator 205. The sixth switch 3315 supplies the output signal of the third NAND gate 3104 to the third node N3 in response to the output signal U/DB of the second inverter 3301.

The seventh through fourteenth switches 3316 through 2223 operate on the similar ways with above described method.

The fifteenth switch 3324 supplies the output signal of the sixth NAND gate 3107 to the eighth node N8 in response to the output signal U/D of the comparator 205. The sixteenth switch 3325 supplies power supply voltage Vcc to the eighth node N8 in response to the output signal U/DB of the second inverter 3301.

The latch unit 350 is initialized by the reset signal RESET, and latches and outputs the first control signals C1$i$ in response to the clock signal CLOCK.

According to an embodiment of the present invention, the latch unit 350 is initialized by the reset signal RESET, and receives and latches the output signals of the third through tenth inverters 3302 through 3309 of the switching unit 330 in response to the clock signal CLOCK and includes a plurality of flip-flops that output the first control signals C11 through C18.

Figure 4:
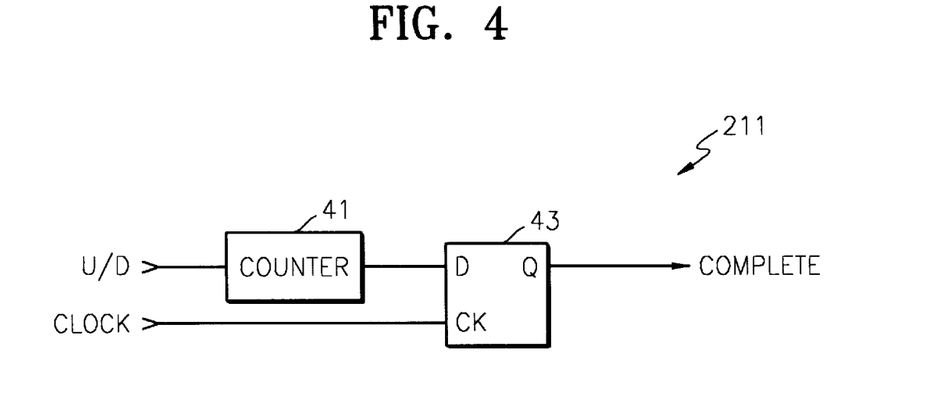
FIG. 4 is a block diagram of a control circuit in FIG. 2.

FIG. 4 is a block diagram of the control circuit 211 in FIG. 2.

Referring to FIG. 4, the control circuit 211 includes a counter 41 and a flip-flop 43.

The counter 41 counts a number of logic value transitions of the output signal U/D of the comparator 205. It is preferable that the logic level of the output signal of the counter 41 is designed to change as the logic level of the output signal U/D of the comparator changes four times consecutively. The flip-flop 43 latches the output signal of the counter 41 in response to the clock signal CLOCK and outputs the complete signal COMPLETE.

Figure 5:
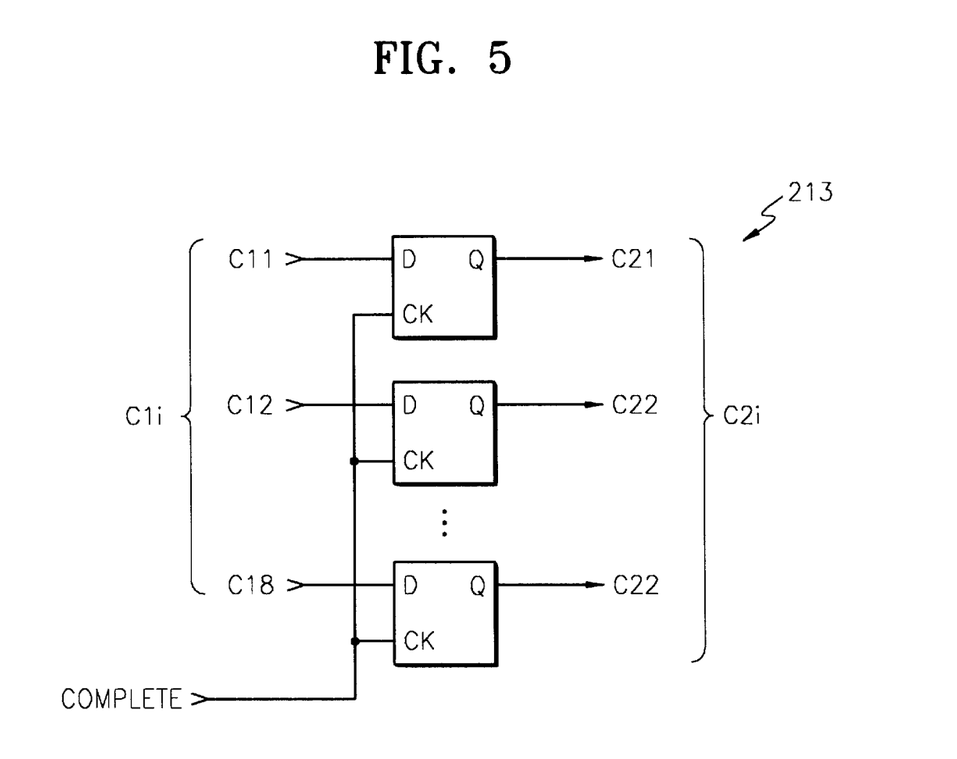
FIG. 5 is a block diagram illustrating a register in FIG. 2.

FIG. 5 is a block diagram the register 213 in FIG. 2.

Referring to FIG. 5, the register 213 includes a plurality of flip-flips. For simplicity of explanations and not to be limited to such number, the register has eight (8) flip-flops. The register 213 latches the first control signals C11 through C18 (or C1$i$) in response to the complete signal COMPLETE and outputs the second control signals C21 through C28 (or C2$i$).

Figure 6:
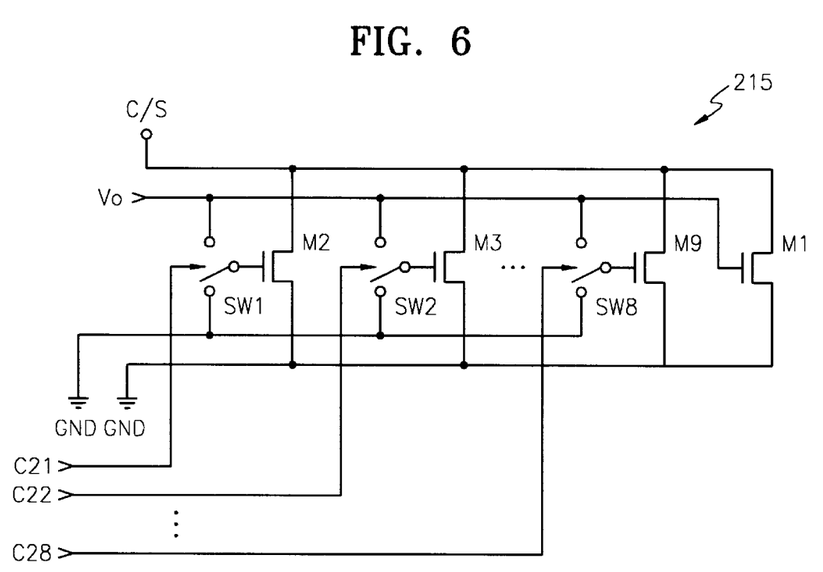
FIG. 6 is a circuit diagram of an impedance adjustment circuit in FIG. 2.

FIG. 6 is a circuit diagram of the impedance adjustment circuit 215 in FIG. 2.

Referring to FIG. 6, the impedance adjustment circuit 215 includes a plurality of switches SW1 through SW8 and a plurality of MOS transistors M1 through M9.

The first MOS transistor M1 has one terminal connected to the comparison output voltage Vtarget, the other terminal connected to the ground voltage GND, and a gate connected to an output voltage Vo.

The second MOS transistor M2 has one terminal connected to the comparison output voltage Vtarget, the other terminal connected to the ground voltage GND and a gate connected to one terminal of the first switch SW1. The first switch SW1 selects either the output voltage Vo or the ground voltage GND in accordance with the first signal C21 of the second control signals C2$i$ and supplies the selected voltage to the gate of the second MOS transistor M2.

Likewise, the third through ninth MOS transistor M3 through M9 have one terminal connected to the comparison output voltage Vtarget node, another terminal connected to the ground voltage GND, and gate connected to the respective second through eighth switches SW2 through SW8. Each of the second through eighth switches SW2 through SW8 selects either the output voltage Vo or the ground voltage GND according to the respective second control signals C22 through C28, and supplies the selected voltage to the gates of the third through ninth MOS transistors M3 through M9.

According to an embodiment of the present invention, preferably, the gates of the plurality MOS transistors M1 through M9 have the same width-to-length ratio.

Figure 7:
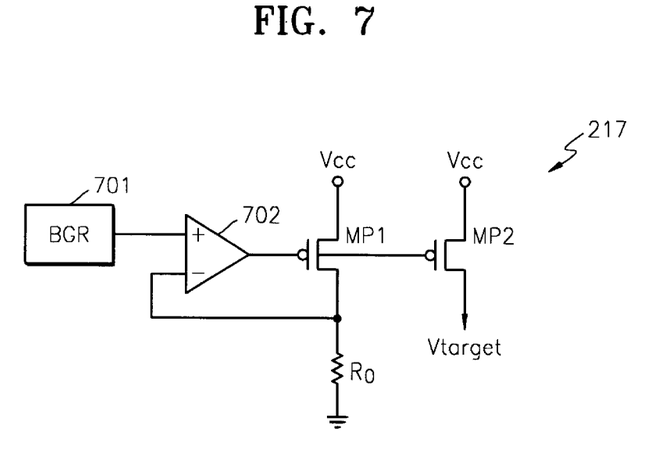
FIG. 7 is a circuit diagram of a current source in FIG. 2.

FIG. 7 is a circuit diagram of the current source 217 in FIG. 2.

Referring to FIG. 7, the current source 217 includes a band gap reference 701, an operational amplifier 702 connected to the band gap reference 701 and a load resistance Ro, and two MOS transistors MP1 and MP2. One terminal of the first MOS transistor MP1 is connected to the power supply voltage Vcc, the other terminal of the first MOS transistor MP1 is connected to the load resistance Ro, and a gate of the first MOS transistor MP1 is connected to the operational amplifier 702. One terminal of the second MOS transistor MP2 is connected to the power supply voltage Vcc, the other terminal of the second MOS transistor MP2 is connected to the comparison output voltage Vtarget, and a gate of the second MOS transistor MP2 is connected to the gate of the first MOS transistor MP1. Since one skilled in the art can easily understand the circuit, explanation of the circuit will be omitted. A designer can adjust the maximum value of the current flowing through the second MOS transistor MP2 by adjusting the size ratio of the MOS transistor MP1 to the MOS transistor MP2.

A method for operating the impedance control circuit 200 according to the present invention will be explained with reference to FIGS. 2 through 7.

The impedance adjustment circuit 215 adjusts current provided by the current source 217 and outputs control signals for causing a predetermined output impedance. First, the impedance control circuit 200 compares the comparison output voltage Vtarget with the reference voltage Vref. Then, the impedance control circuit 200 generates second control signals C2$i$ to make the comparison output voltage Vtarget and the reference voltage Vref equal. For the above functions, the comparator 205, the thermal code generator 209, the control circuit 211, and the register 213 are used.

The comparator 205 compares the Vref with the Vtarget and outputs "1" or "0" as a logic value. For better understanding, if the Vref is higher than the Vtarget, the comparator outputs "0". Otherwise, the comparator outputs "1". If the Vtarget is lower than the Vref, it means that the impedance of the impedance adjustment circuit 215 is lower than the desired impedance. In that case, of the MOS transistors connected in parallel, the number of MOS transistors turned off should be increased to increase the impedance value and make the Vtarget and the Vref equal. It is assumed that the comparator 205 compares the voltages at the falling edge of the clock signal CLOCK.

The operation mode signal P/D refers to the power down enable signal and disables the comparator 205 when the impedance control circuit 200 does not operate. It is preferable that in a case where the comparator 205 is in a power down mode, the latch circuit 207 is connected to an output port of the comparator 205 to save the output signal U/D of the comparator 205.

The output signal U/D of the comparator 205 is used to generate the second control signals C2i that open or close the MOS transistors M2 through M9 of the impedance adjustment circuit 215. If the logic value of the output signal U/D is "0", that is, if the Vref is higher than the Vtarget, the first control signals C1i output "0" until the output signal U/D of the comparator 205 becomes "1" whenever the clock signal CLOCK is fed.

The output signal U/D of the comparator 205 becomes "1" when the MOS transistors of the impedance adjustment circuits 215 are turned on successively by the second control signals C2i designated by the first control signals C1i. If the MOS transistor that is turned on is turned off, the output signal U/D of the comparator 205 is "0". For the Vtarget and the Vref have approximately the same value, adding or deleting one of the MOS transistors connected in parallel may change the logic value of the output signal U/D.

As described above, in the impedance adjustment circuit 215, if one MOS transistor turned on is added while the output signal of the comparator 205 is "0", the output signal U/D of the comparator becomes "1". If the MOS transistor is turned off, the output signal U/D of the comparator 205 becomes "0". The control circuit counts the number of logic value transitions of the output signal U/D of the comparator 205 and determines the logic value of the second control signals C2i.

According to an embodiment of the present invention, the logic value of a signal included in the first control signals C1i is determined in consideration of the logic value of more than two prior signals so that errors in the first control signal C1i or the second control signal C2i due to noise included in the Vref and the Vtarget input to the comparator 205 do not occur. The thermal code generator 209 performs the above function.

Figure 8:
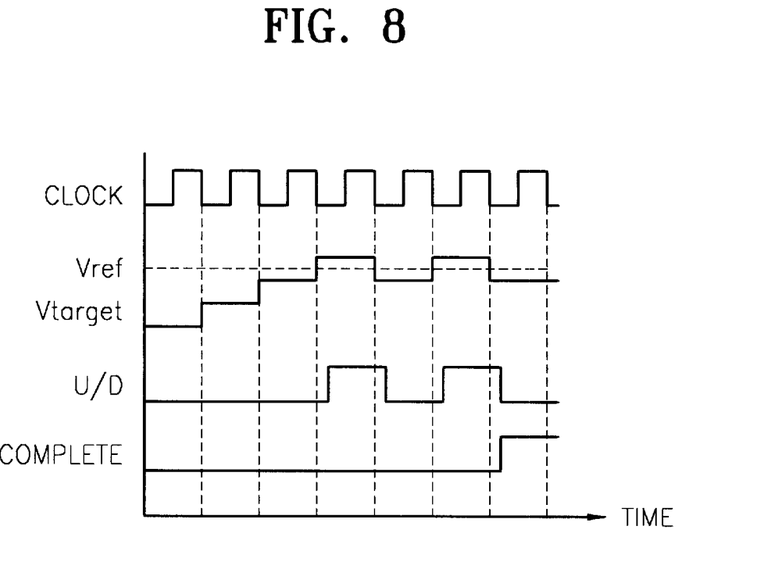
FIG. 8 is a waveform diagram showing signals of the impedance control circuit according to an embodiment of the present invention.

FIG. 8 is a waveform diagram showing signals of the impedance control circuit 200 according to an embodiment of the present invention.

In FIG. 8, if the output signal U/D is "0", the comparison output voltage Vtarget increases by a predetermined amount every clock signal interval until the output signal U/D becomes "1". At the next clock signal interval, the comparison output voltage Vtarget is reduced by a predetermined amount. If the reduced comparison Vtarget is lower than the reference voltage Vref, the output signal U/D is "0" again. Likewise, the final change of the Vtarget may cause the output signal (U/D) to change continuously, and the comparator 205 enables the complete signal COMPLETE after a predetermined amount of time.

If the complete signal COMPLETE is enabled, the comparator 205 does not operate any more and one of the second control signals C2i can be provided to the location where an output driving transistor is necessary.

Figure 9:
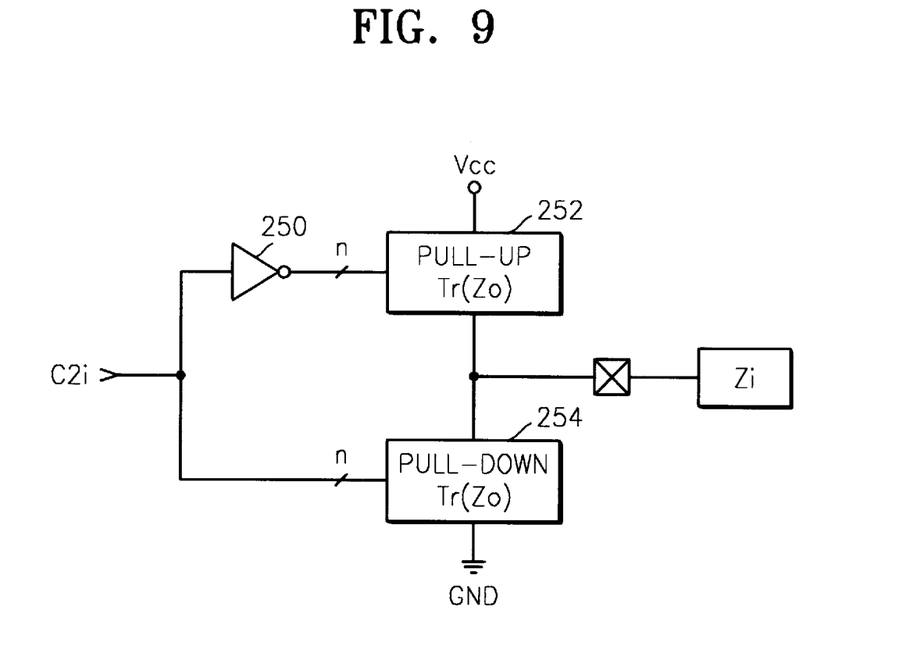
FIG. 9 is another circuit diagram of an impedance adjustment circuit in FIG. 2.

FIG. 9 is another circuit diagram of the impedance adjustment circuit 215 (in FIG. 2).

Referring to FIG. 9, the impedance adjustment circuit 215 includes an inverter 250, a pull-up transistor 252 connected to a power supply voltage Vcc, and a pull-down transistor 254 connected to a ground voltage GND. If the logic value of the second control signals C2i is "1", the pull-up transistor 252 and the pull-down transistor 254 are turned on. On the contrary, if the logic value of the second control signals C2i is "0", the pull-up transistor 252 and the pull-down transistor 254 are turned off. Therefore, the second control signals C2i can match an output impedance of each output driving transistor and an input impedance Zi of the external system of the semiconductor device.

As described above, since the impedance control circuit 200 according to embodiments of the present invention does not use an external resistor for impedance matching, the PCB size can be reduced. In particular, a controllable current source matches the impedance more precise compared to the external resistor.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An impedance control circuit comprising:
   a current source for providing a substantially constant current;
   an impedance adjustment circuit connected to the current source, for adjusting the current fed by the current source in response to a plurality of second control signals and to output an output signal at a target voltage;
   a comparator for comparing a reference voltage with the target voltage and outputting a compared signal;
   a thermal code generator for receiving the compared signal and a clock signal and outputting a plurality of first control signals corresponding to the compared signal in response to the clock signal;
   a control circuit for receiving the compared signal and the clock signal and counting the number of logic value transitions of the compared signal and for generating a complete signal in response to the clock signal to stop operating the comparator if a predetermined condition is met; and
   a register for latching the first control signals in response to the complete signal and generating the second control signals.

2. The impedance control circuit of claim 1, further comprising a latch circuit for storing the compared signal during a predetermined period and outputting the output signal having constant voltage.

3. The impedance control circuit of claim 1, further comprising:
   a first low-pass filter for filtering a high-frequency noise at the reference voltage node and transmitting the filtered reference voltage to one input port of the comparator; and
   a second low-pass filter for filtering a high-frequency noise at the target voltage node and transmitting the filtered output to the other input port of the comparator.

4. The impedance control circuit of claim 1, wherein the thermal code generator comprises:
   a latch unit initialized by a reset signal, for latching and outputting the plurality of first control signals in response to the clock signal;
   a logic unit for receiving the first control signals and outputting a plurality of third control signals generated by logic operations of two consecutive control signals of the first control signals; and
   a switching unit for switching the plurality of third control signals in response to the output signal of the comparator and sending a plurality of fourth control signals to the latch unit.

5. The impedance control circuit of claim 4, wherein the logic unit comprises:
   a first inverter for inverting the first signal of the first control signals;
   a plurality of NAND gates for receiving two consecutive signals of the first control signals and outputting the plurality of third control signals.

6. The impedance control circuit of claim 4, wherein the switching unit comprises:
   a second inverter for inverting the output signal;
   a plurality of inverters for inverting the plurality of the third control signals in response to the output signal.

7. The impedance control circuit of claim 6, wherein the plurality of inverters comprises:
   a third inverter for inverting and outputting the signal at a first node;
   a fourth inverter for inverting and outputting the signal at a second node;
   an $(N+1)^{th}$ inverter for inverting and outputting the signal at an $(N-1)^{th}$ node (where N is an integer);
   an $(N+2)^{th}$ inverter for inverting and outputting the signal at an $N^{th}$ node;
   a first switch for supplying a first ground voltage to the first node in response to the output signal of the comparator;
   a second switch for supplying an output signal of a first NAND gate of the logic unit to the first node in response to an output signal of the second inverter;
   a third switch for supplying an output signal of the first inverter to the second node in response to the output signal of a comparator;
   a fourth switch for supplying an output signal of a second NAND gate of the logic unit to the second node in response to the output signal of the second inverter;
   a fifth switch for supplying the output signal of the first NAND gate of the logic unit to a third node in response to the output signal of the comparator;
   a sixth switch for supplying an output signal of a third NAND gate of the logic unit to the third node in response to the output signal of the second inverter;
   a $(2(N-1)-1)^{th}$ switch for supplying an output signal of a $(N-3)^{th}$ NAND gate of the logic unit to an $(N-1)^{th}$ node in response to the output signal of the comparator;
   a $(2(N-1))^{th}$ switch for supplying an output signal of an $(N-1)^{th}$ NAND gate of the logic unit to a $(N-1)^{th}$ node in response to the output signal of the second, inverter;
   a $2N-1^{th}$ switch for supplying an output signal of an $(N-2)^{th}$ NAND gate of the logic unit to an $N^{th}$ node in response to the output signal of the comparator; and
   a $2N^{th}$ switch for supplying a second ground voltage to an $N^{th}$ node in response to the output signal of the second inverter.

8. The impedance control circuit of claim 4, wherein the latch unit includes a plurality of flip-flops.

9. The impedance control circuit of claim 8, wherein the plurality of flip-flops are initialized by the, reset signal, and receives and latches the plurality of fourth control signals in response to the clock signal.

10. The impedance control circuit of claim 1, wherein the control circuit comprises:
    a counter for counting the number of logic value transitions of the output signal; and
    a flip-flop for latching the counted number of the counter and outputting the complete signal in response to the clock signal.

11. The impedance control circuit of claim 1, wherein the register comprises a plurality of flip-flops for receiving the plurality of first control signals and generating the plurality of second control signals in response to the complete signal.

12. The impedance control circuit of claim 1, wherein an impedance adjustment circuit comprises a plurality of MOS transistors, each of the plurality of MOS transistors having a first terminal, a second terminal, and a gate, wherein the first terminal is connected to the current source, the second terminal is connected to a first ground voltage, and the gate is connected to a switch, the switch is connected a second ground voltage or an output voltage in response to the plurality of second control signals.

13. The impedance control circuit of claim 12, wherein a plurality MOS transistors have gates with the same width-to-length ratio.

14. The impedance control circuit of claim 1, wherein an impedance adjustment circuit comprises an inverter, a pull-up transistor connected to a power supply voltage, and a pull-down transistor connected to a ground voltage, the inverter and the pull-down transistor receive the plurality of the second control signals.

15. The impedance control circuit of claim 1, wherein an impedance adjustment circuit comprises:
    a first MOS transistor which has one terminal connected to the current source, another terminal connected to a first ground voltage (GND), and a gate which receives an output signal;
    a first switch which selects the output voltage or the first ground voltage according to one of the second control signals;
    a second MOS transistor which has one terminal connected to the current source, another terminal connected to the first ground voltage, and a gate which receives the signal selected by the first switch;
    a second switch which receives the output voltage or the first ground voltage depending on one of the second control signals;
    a third MOS transistor which has one terminal connected to the current source, another terminal connected to the first ground voltage, and a gate which receives the signal selected by the second switch;
    an $N^{th}$ switch (where N is an integer) which selects the output voltage or the first ground voltage depending on one of the second control signals of the register; and
    an $(N+1)^{th}$ MOS transistor which has one terminal connected to the current source, another terminal connected to the first ground voltage, and a gate which receives the signal selected by the $N^{th}$ switch.

16. The impedance control circuit of claim 1, wherein the predetermined condition is that the output voltage of the comparator has a logic value that changes four times consecutively.

17. The impedance control circuit of claim 1, wherein the current source comprises a band gap reference, an operational amplifier, a load resistance, and two MOS transistors, wherein two input of operational amplifier are connected to the band gap reference and the load resistance, one terminal of the first MOS transistor is connected to the power supply voltage, the other terminal of the first MOS transistor is connected to the load resistance, and a gate of the first MOS transistor is connected to the operational amplifier, and one terminal of the second MOS transistor is connected to the power supply voltage, the other terminal of the second MOS transistor is connected to the comparison output voltage, and a gate of the second MOS transistor is connected to the gate of the first MOS transistor.

18. A method of operating an impedance control circuit, the method comprising the steps of:

generating an output signal by comparing a reference voltage with a comparison output voltage generated between a current source and an impedance adjustment circuit;

outputting a plurality of first control signals corresponding to the output signal in response to a clock signal;

latching the plurality of first control signals in response to a complete signal and generating a plurality of second control signals; and adjusting current in response to the plurality of second control signals to match the reference voltage with a comparison output voltage.

19. The method of claim 18, further comprising the steps of:

filtering a high-frequency noise of the reference voltage; and filtering a high-frequency noise of the comparison output voltage.

20. The method of claim 18, wherein the complete signal is generated by the steps of:

counting the number of logic value transitions of the output signal; and generating the complete signal by latching the number of logic value transitions in response to the clock signal.

21. The method of claim 18, wherein the step of adjusting current is performed by turning-on or turning-off a plurality of MOS transistors connected in parallel in response to the plurality of second control signals.

* * * * *